(12) United States Patent
Shi et al.

(10) Patent No.: US 12,174,250 B2
(45) Date of Patent: Dec. 24, 2024

(54) METHOD FOR CHECKING DFT CIRCUIT, TEST PLATFORM, STORAGE MEDIUM AND TEST SYSTEM

(71) Applicant: CHANGXIN MEMORY TECHNOLOGIES, INC., Hefei (CN)

(72) Inventors: Teng Shi, Hefei (CN); Kang Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 18/163,236

(22) Filed: Feb. 1, 2023

(65) Prior Publication Data

US 2023/0358805 A1 Nov. 9, 2023

Related U.S. Application Data

(63) Continuation of application No. PCT/CN2022/093907, filed on May 19, 2022.

(30) Foreign Application Priority Data

May 6, 2022 (CN) .......................... 202210486536.3

(51) Int. Cl.
*G01R 31/317* (2006.01)

(52) U.S. Cl.
CPC . *G01R 31/31704* (2013.01); *G01R 31/31701* (2013.01); *G01R 31/31722* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 5,651,011 A | 7/1997 | Keeth | |
| 5,914,968 A | 6/1999 | Keeth | |
| 5,966,388 A | 10/1999 | Wright | |
| 6,154,860 A | 11/2000 | Wright | |
| 6,178,532 B1 | 1/2001 | Pierce | |
| 6,550,026 B1 | 4/2003 | Wright | |
| 6,823,485 B1 | 11/2004 | Muranaka | |
| 8,537,628 B2 * | 9/2013 | Kim | G11C 29/46 365/233.5 |
| 10,614,906 B2 | 4/2020 | Ryu | |
| 2001/0013110 A1 | 8/2001 | Pierce | |
| 2004/0252564 A1 * | 12/2004 | Do | G11C 29/46 365/201 |

(Continued)

FOREIGN PATENT DOCUMENTS

| | | |
|---|---|---|
| CN | 101937722 A | 1/2011 |
| CN | 108447522 A | 8/2018 |

(Continued)

*Primary Examiner* — Tung X Nguyen

(74) *Attorney, Agent, or Firm* — Syncoda LLC; Feng Ma

(57) ABSTRACT

A method for checking a Design for Test (DFT) circuit includes: transmitting a control signal to the DFT circuit to determine test mode signals output by the DFT circuit, with the DFT circuit being configured to sequentially select multiple address latches according to the control signal to output the test mode signals; analyzing the test mode signals to determine whether the multiple address latches in the DFT circuit have an error; and outputting a simulation result report.

16 Claims, 6 Drawing Sheets

(56) References Cited

U.S. PATENT DOCUMENTS

2012/0002494 A1    1/2012   Kim
2019/0027230 A1    1/2019   Ryu et al.
2020/0388345 A1   12/2020   Ning

FOREIGN PATENT DOCUMENTS

| CN | 108564982 A | 9/2018 |
| CN | 110942798 A | 3/2020 |
| CN | 112214963 A | 1/2021 |
| CN | 112992251 A | 6/2021 |

\* cited by examiner

METHOD FOR CHECKING DFT CIRCUIT, TEST PLATFORM, STORAGE MEDIUM AND TEST SYSTEM

CROSS-REFERENCE TO RELATED APPLICATIONS

This is a continuation of International Application No. PCT/CN2022/093907 filed on May 19, 2022, which claims priority to Chinese Patent Application No. 202210486536.3 filed on May 6, 2022. The disclosures of the above-referenced applications are hereby incorporated by reference in their entirety.

BACKGROUND

There are multiple DFT (Design for Test) circuits in an electronic device, which may be configured to implement such functions as circuit boundary scan, internal parameter output, internal function switch, local circuit timing adjustment, etc., under different test modes. Specifically, the DFT circuits are controlled by multiple address latches. Under different test modes, corresponding circuit parts are required to be enabled by different address latches for testing. Further, output pins of the same address latch may further correspond to different test modes. In other words, under a specific test mode, a corresponding circuit part is required to be enabled through a specific pin of a specific address latch. However, due to the fact that, the address latches are relatively large in number, address latch configuration errors are often caused, affecting normal use of test functions.

SUMMARY

The disclosure relates to the technical field of semiconductor memory, in particular to a method for checking a Design for Test (DFT) circuit, a test platform, a storage medium and a test system.

The disclosure provides a method for checking a Design for Test (DFT) circuit, a test platform, a storage medium and a test system, thereby checking whether there is a configuration error in an address latch and improving working efficiency and verification accuracy.

The technical scheme of the disclosure is implemented in the following aspects.

In a first aspect, an embodiment of the disclosure provides a method for checking a DFT circuit applied to a test platform. The DFT circuit includes multiple address latches, and the test platform is connected to the DFT circuit. The method includes: transmitting a control signal to the DFT circuit to determine test mode signals output by the DFT circuit, the DFT circuit being configured to sequentially select multiple address latches according to the control signal to output the test mode signals; analyzing the test mode signals to determine whether the multiple address latches in the DFT circuit have an error; and outputting a simulation result report.

In a second aspect, an embodiment of the disclosure provides a test platform connected to a DFT circuit including multiple address latches. The test platform includes a test circuit, an analysis circuit and an output circuit. The test circuit is configured to transmit a control signal to the DFT circuit to determine test mode signals output by the DFT circuit. The DFT circuit is configured to sequentially select multiple address latches according to the control signal to output the test mode signals. The analysis circuit is configured to analyze the test mode signals to determine whether the multiple address latches in the DFT circuit have an error. The output circuit is configured to output a simulation result report.

In a third aspect, an embodiment of the disclosure provides a test platform connected to a Design for Test (DFT) circuit comprising multiple address latches. The test platform includes a memory and a processor. The memory is configured to store computer-executable instructions which can be run by the processor. The processor is configured to, when the computer-executable instructions are run, perform operations of: transmitting a control signal to the DFT circuit to determine test mode signals output by the DFT circuit, wherein the DFT circuit is configured to sequentially select multiple address latches according to the control signal to output the test mode signals; analyzing the test mode signals to determine whether the multiple address latches in the DFT circuit have an error; and outputting a simulation result report.

DETAILED DESCRIPTION

Figure 1:
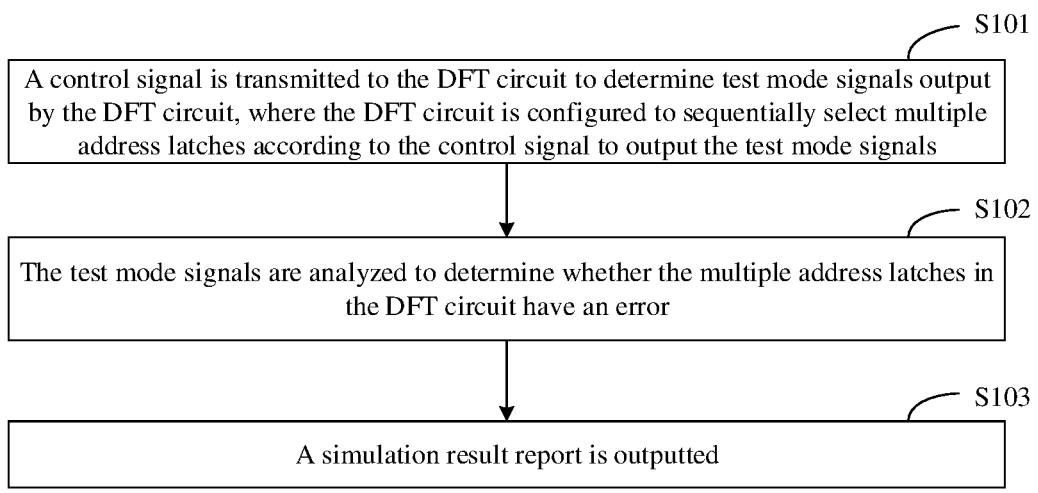
FIG. 1 illustrates a schematic flow diagram of a method for checking a Design for Test (DFT) circuit according to an embodiment of the disclosure.

The technical scheme according to embodiments of the disclosure will be clearly and completely described below with reference to the drawings of the embodiments of the disclosure. It should be understood that, the description of the specific embodiments herein is merely intended to illustrate the disclosure and not to limit the disclosure. It should be further noted that, merely parts related to the disclosure are illustrated in the drawings to facilitate the description.

Unless otherwise defined, all technical and scientific terms used herein have same meanings as those commonly understood by those skilled in the art of the disclosure. The terms used herein are merely for the description of the embodiments of the disclosure and not intended to limit the disclosure.

In the following description, "some embodiments" is used to describe a subset of all possible embodiments. It should be understood that, "some embodiments" may be same or different subsets of all possible embodiments, which may be combined with each other on a non-conflict basis.

Specific terms and abbreviations related to the embodiments of the disclosure will be illustrated below.

DRAM: Dynamic Random Access Memory;

LPDDR: Low Power Double Data Rate SDRAM (Synchronous DRAM); and

LPDDR5: Memory conforming to the 5th generation LPDDR standard.

There are multiple DFT (Design for Test) circuits in a semiconductor memory (e.g., a DRAM chip). The DFT circuits are configured to implement such functions as circuit boundary scan, internal parameter output, internal function switch, local circuit timing adjustment, etc., without affecting an original design function. Illustratively, there are more than 500 test modes in a LPDDR5, each of which may be enabled by accessing a specific test mode address and may be presented as multiple address latches in the circuit. There may not be a unique address latch corresponding to an address, and multiple address latches may be distributed in multiple positions of the circuit according to a function requirement to better control the DFT circuit. A designer collects all test modes, and determines an address to be accessed, and number and positions of address latches corresponding to each test mode by means of a table. However, the address latches corresponding to each test mode are large in number, and the address latches may be distributed in more than 10 designated positions of the chip, which may give rise to configuration errors.

Embodiments of the disclosure provide a method for checking a Design for Test (DFT) circuit, thereby quickly and efficiently checking whether there is a configuration error in an address latch in the DFT circuit, and improving working efficiency and verification accuracy.

The embodiments of the disclosure will be illustrated in detail below with reference to the drawings.

According to an embodiment of the disclosure, FIG. 1 illustrates a schematic flow diagram of a method for checking a DFT circuit according to the embodiment of the disclosure. As shown in FIG. 1, the method may include operations S101 to S103.

In S101, a control signal is transmitted to the DFT circuit to determine test mode signals output by the DFT circuit, where the DFT circuit is configured to sequentially select multiple address latches according to the control signal to output the test mode signals.

In S102, the test mode signals are analyzed to determine whether the multiple address latches in the DFT circuit have an error.

In S103, a simulation result report is outputted.

It should be noted that, the method for checking a DFT circuit according to the embodiment of the disclosure is applied to a test platform, the test platform is connected to the DFT circuit, and the DFT circuit includes multiple address latches, therefore a designer can test the configuration of multiple address latches in the DFT circuit through the test platform.

Herein, the test platform may include multiple computing devices, and the test platform is configured to implement the method for checking a DFT circuit through a pre-mounted software program. Illustratively, a software program may be programmed in the verilog language or perl language. Further, a DFT circuit may refer to a circuit in a DRAM.

It should be noted that, according to some embodiments, after a test platform is connected to a DFT circuit, a method for checking a DFT circuit further includes:

binding the test platform and multiple output signals of multiple address latches, and establishing a preset correlation relationship in the test platform so that the test platform can monitor a signal jump in the DFT circuit in real time, where the preset correlation relationship is configured to monitor an output signal jump, i.e., a test mode signal jump in the DFT circuit in the test platform.

In this way, after the test platform transmits a control signal to the DFT circuit, if an output signal of a specific address latch in the DFT circuit jumps, the test platform can identify the output signal which jumps according to the preset correlation relationship, and then determine the corresponding address latch to check whether there is a configuration error in the address latch, thereby improving working efficiency and verification accuracy.

Figure 2:
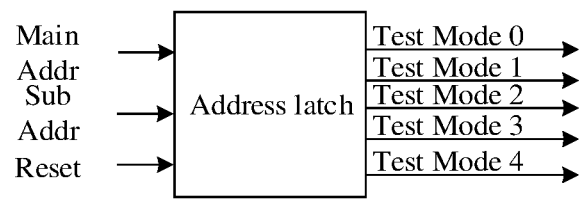
FIG. 2 illustrates a schematic structural diagram of an address latch according to an embodiment of the disclosure.

FIG. 2 illustrates a schematic structural diagram of an address latch according to an embodiment of the disclosure. As shown in FIG. 2, input terminals of the address latch are respectively configured to receive a main address signal Main Addr and a sub address signal Sub Addr to output a test mode signal (e.g., Test Mode0, Test Mode1, Test Mode2, Test Mode3 and Test Mode4) through a corresponding output pin according to the main address signal Main Addr and the sub address signal Sub Addr, thereby controlling the subsequent working state of a corresponding circuit part. Specifically, a main address signal Main Addr is configured to select an address latch, and a sub address signal Sub Addr is configured to control the selected address latch to output a corresponding test mode signal.

According to some embodiments, a control signal includes multiple groups of address signals, each group of address signals include a main address signal Main Addr and a preset number of sub address signals Sub Addr. Therefore, the operation of transmitting a control signal to a DFT circuit to determine test mode signals output by the DFT circuit includes:

transmitting a main address signal Main Addr to the DFT circuit to select a target address latch from the multiple address latches; and sequentially transmitting the preset number of sub address signals Sub Addr to the DFT circuit to control the target address latch to output the test mode signals in a traversal manner.

It should be noted that, a preset number is required to be determined according to the number of output pins of an address latch, which is not limited herein. Illustratively, a preset number is 5 in an address latch shown in FIG. 2.

It should be understood that, a main address signal may be transmitted first, and then a preset number of sub address signals are sequentially transmitted. Alternatively, a main address signal and a first sub address signal may be transmitted simultaneously. Further, in traversing all sub address signals, the corresponding main address signal is active constantly. In other words, after transmitting a main address signal, the main address signal remains active until a next main address signal is transmitted.

As shown in FIG. 2, the address latch is further configured to receive a reset signal Reset and reset an output signal of the address latch to be an initial value when receiving the reset signal Reset. Therefore, according to some embodiments, after sequentially transmitting the preset number of sub address signals to a DFT circuit, a method for checking a DFT circuit further includes: resetting a target address latch.

It should be noted that, an address latch in the DFT circuit may have the following types of errors: error (1), main address configuration error; error (2), sub address configuration error; error (3), initial value configuration error; error (4), omission of the address latch in a preset region; and error (5), misposition of the address latch outside a preset region.

Illustratively, there are 6 regions in a DRAM chip, i.e., region A, region B, etc., and region F, and address latches corresponding to a test mode are densely arranged in the regions, then each type of error may be presented as follows.

Error (1), main address configuration error: an address latch corresponding to a main address signal 100 is planned to be positioned in region D, however, a designer accidentally configures the main address signal of the address latch to be 101.

Error (2), sub address configuration error: address latches corresponding to a main address signal 100 are respectively positioned in region A to region F, and sub addresses 2 of an address latch in region A to region F are planned to be configured to control a test mode TM100, however, a designer accidentally connects the test mode controlled by the sub address 2 of the address latch in region F to a test mode TM200.

Error (3), initial value configuration error: an initial value of each of five output pins of an address latch may be set to be 0 or 1, and a designer may erroneously configure an initial value.

Error (4), omission or misposition of an address latch in a preset region: address latches corresponding to a main address signal 100 are planned to be positioned in 4 regions from region A to region D, however, a designer accidentally omits a corresponding address latch in region D or mispositions the corresponding address latch in region E.

Error (5), misposition of an address latch outside a preset region: an address latch is positioned outside region A to region F.

A specific method to detect the foregoing types of errors will be illustrated below.

According to some embodiments, the operation of analyzing the test mode signals to determine whether there is an error in multiple address latches in a DFT circuit includes:

determining a target address latch and a target number according to each test mode signal output by the DFT circuit after transmitting the main address signal to the DFT circuit; and analyzing the target address latch and the target number based on a first design parameter to determine whether the multiple address latches in the DFT circuit have a first type of error.

Herein, the first type of error is a main address configuration error of an address latch, or misposition of an address latch, or omission of an address latch in a preset region, details of which may be understood with reference to those of the foregoing error (1) or error (4). Further, a preset region is a region in the DFT circuit, in which an address latch is positioned.

It should be noted that, correct information of each address latch is recorded in a design parameter of the DFT circuit, which may be presented in multiple forms, e.g., a table, index tree, etc., which is not limited herein.

A main address signal is configured to select an address latch. If a target address latch which is actually monitored does not conform to the design parameter of the DFT circuit, the main address signal may be erroneously configured to correspond to a wrong address latch. Further, a target address latch is determined according to a circuit position corresponding to an output signal which jumps, therefore the main address signal may further be configured to correspond to a correct address latch, which may be mispositioned.

According to some embodiments, a target number includes a first target number, which is the number of the target address latches, and a second target number, which is the number of the target address latches belonging to the preset region.

The operation of determining a target address latch and a target number according to each test mode signal output by a DFT circuit includes:

determining target position information corresponding to each test mode signal according to a preset correlation relationship, where the preset correlation relationship is configured to indicate circuit position information of each test mode signal in the DFT circuit; performing keyword match processing on the target position information to determine the target address latches; and determining the first target number and the second target number based on the target position information.

It should be noted that, the preset correlation relationship is configured to indicate the circuit position information of each test mode signal in the DFT circuit, i.e., the target position information is configured to determine the circuit position layer of an output signal which jumps, thereby determining the first target number, second target number and target address latch.

Illustratively, when an output signal of an address latch jumps, a $sformat function in a test platform will be triggered to fetch and obtain target position information, which may be a string combining letters and numbers. Then, the address latch which acts is identified by performing keyword match processing on the target position information. Illustratively, if target position information of an address latch is TOP.Chip.*I_TMLeft.I_LatchX5_1955 and target position information of another address latch is TOP.Chip.*.I_TMRight.I_Latch_278, the two address latches may be distinguished according to the keywords of "TMLeft" and "TMRight".

It should be noted that, illustratively, after transmitting a main address signal 100, two test mode signals which jump are captured, and the two test mode signals respectively belong to a "TMLeft" region and a "TMRight" region, each of which is a preset region. In a first case, according to a first design parameter, the main address signal 100 corresponds to two address latches respectively positioned in the "TMLeft" region and "TMRight" region, and then there is no first type of error in the address latches corresponding to the main address signal 100. In a second case, according to a first design parameter, the main address signal 100 corresponds to three address latches respectively positioned in the "TMLeft" region, "TMRight" region and a "DMLeft" region, and then an address latch in the "DMLeft" region corresponding to the main address signal 100 is omitted, or the main address signal corresponding to the address latch in the "DMLeft" region is erroneously configured to be 101. In a third case, according to a first design parameter, the main address signal 100 corresponds to a "DMRight" region and a "DMLeft" region, and then address latches corresponding to the main address signal 100 are mispositioned in the "TMRight" region and the "TMLeft" region. Herein, both misposition and omission may result in failing to detect a corresponding address latch, and misposition and omission are difficult to distinguish clearly and there is no significance to distinguish misposition and omission, therefore each of both is classified as a first type of error, which may be manually verified by a designer later.

Further illustratively, when a first target number and a second target number are different from each other, an address latch may be mispositioned outside a preset region, which may be understood with reference to the following illustration.

In this way, whether there is a main address configuration error, omission of an address latch in a preset region or misposition of an address latch in the DFT circuit may be tested according to corresponding relation between a main address signal and a target address latch.

It should be understood that, whether there is a first type of error may be tested and determined in multiple circumstances. Illustratively, if an output signal jumps when an address latch is switched from an unselected state to a selected state, whether there is a first type of error in the address latch may be tested after transmitting a first main address signal. Alternatively, if an output signal does not jump when an address latch is switched from an unselected state to a selected state, whether there is a first type of error may be tested merely after transmitting at least first sub address signal. Definitely, in practical application, results of monitored test mode signals may be analyzed overall after transmitting each control signal.

According to some embodiments, the operation of analyzing the test mode signals to determine whether there is an error in multiple address latches in a DFT circuit further includes:

determining a signal value array of each target address latch according to the test mode signals output by the DFT circuit after sequentially transmitting the preset number of sub address signals to the DFT circuit; and analyzing the signal value array based on a second design parameter to determine whether the multiple address latches in the DFT circuit have a second type of error.

Herein, the second type of error is an initial value configuration error of an address latch, details of which may be understood with reference to those of the foregoing error (3).

According to some embodiments, the operation of determining a signal value array of each target address latch according to the test mode signals output by the DFT circuit includes:

determining a level state of a corresponding output pin in the target address latch according to a test mode signal output by the DFT circuit after transmitting one of the sub address signals to the DFT circuit; and performing binary conversion processing on the level state of the corresponding output pin in the target address latch to obtain a signal value in the signal value array, and obtaining the signal value array after sequentially transmitting the preset number of sub address signals to the DFT circuit.

It should be noted that, illustratively when the number of output pins of a target address latch is 5, a level state of each output pin in the target address latch is obtained after transmitting a sub address signal. Illustratively, if an output pin is at high level state, a signal value "1" is obtained; and if an output pin is at low level state, a signal value "0" is obtained, thereby performing binary conversion processing. A signal value of an output pin 1 corresponding to a first sub address signal, etc., and a signal value of an output pin 5 corresponding to a fifth sub address signal are combined to obtain a signal value array of "01001" after transmitting a preset number of sub address signals (merely for illustration). Meanwhile, each address latch may further correspond to an expected signal value array according to a design parameter of a DFT circuit. If the obtained signal value array is identical to the corresponding expected signal value array, there is no second type of error in the corresponding address latch. If the obtained signal value array is not identical to the corresponding expected signal value array, there is a second type of error in the corresponding address latch, i.e., there is an initial value configuration error.

Illustratively, if an initial value of an output pin 1 in an address latch should be 0, but is erroneously configured to be 1, an initial value configuration error in the address latch will be detected after all sub address signals are traversed.

It should be understood that, a main address signal may be configured to simultaneously select same address latches in different regions. Particularly, according to the embodiments of the disclosure, address latches in different regions corresponding to a main address signal are referred to as different address latches to facilitate the illustration and the following illustration is made thereon. Habitually in the industry, address latches in different regions corresponding to a main address signal may further be referred to as an address latch, therefore the following description may further be understood thereon.

That is, multiple address latches in different regions may be selected according to a test mode, and then a main address signal configured to indicate the test mode is configured to select the multiple address latches simultaneously, i.e., a main address signal may be configured to select one or more target address latches.

Therefore, when there are multiple target address latches, a method for checking a DFT circuit further includes:

determining multiple signal names according to each test mode signal output by a DFT circuit after transmitting one of the sub address signals to the DFT circuit; and performing consistency comparison on the multiple signal names to determine whether the multiple address latches in the DFT circuit have a third type of error.

Herein, the third type of error is a sub address configuration error of an address latch, details of which may be understood with reference to those of the foregoing error (2).

It should be noted that, output signals of address latches corresponding to a same address signal (same in terms of main address signal and sub address signal) theoretically correspond to a same test mode, and then same signal names should be output. Therefore, whether the multiple address latches in the DFT circuit have a third type of error may be determined according to whether the signal names are identical to each other.

According to some embodiments, the operation of determining multiple signal names according to each test mode signal output by a DFT circuit includes:

determining multiple pieces of target position information respectively corresponding to the test mode signals according to a preset correlation relationship; and performing character interception on the multiple pieces of target position information to obtain the multiple signal names.

According to some embodiments, the operation of performing consistency comparison on multiple signal names includes:

determining identifier values respectively corresponding to the multiple signal names by accumulating an ASCII code value of each element in one signal name; and comparing the identifier values respectively corresponding to the multiple signal names to determine whether the multiple signal names are identical to each other.

Illustratively, a test platform captures two test mode signals which jump after transmitting a main address signal and a sub address signal, two pieces of target position information respectively corresponding to two test mode signals are TOP.Chip.*.I_TMLeft. EnEcc and TOP.Chip.*.I_TMRight. EnEcc, an ASCII code cumulative value of the former signal name "EnEcc" and that of the latter signal name "EnEcc" are identical to each other, and then the selected address latches correspond to a same control object. If two pieces of target position information respectively corresponding to two output signals which jump are TOP.Chip.*.I_TMLeft. EnEcc and TOP.Chip.*.I_TMRight. EnOut, an ASCII code cumulative value of the former signal name "EnEcc" and that of the latter signal name "EnOut" are not identical to each other, and then the selected address latches correspond to different control objects.

According to some embodiments, when signal binding is implemented on a test platform and a DFT circuit, generally a preset region is configured to be a binding object. If an address latch is mispositioned outside a preset region, the test platform cannot capture an output signal thereof, and there may be missed detection. Therefore, according to some embodiments, a method for checking a DFT circuit further includes:

counting to obtain a first total number and a second total number after all main address signals are transmitted in a traversal manner to the DFT circuit, where the first total number is the total number of times that multiple address latches in the DFT circuit are selected, and a second total number is the total number of times that multiple address latches in a preset region are selected; and analyzing the first total number and the second total number based on a third design parameter to determine whether there is a fourth type of error in the DFT circuit. Herein, the fourth type of error is misposition of an address latch outside a preset region.

Herein, the third design parameter is an expected total number of times that address latches in the DFT circuit are selected, and the fourth type of error is misposition of an address latch outside a preset region, details of which may be understood with reference to those of the foregoing error (5).

Illustratively, if a third design parameter, a first total number and a second total number are the same, there is no misposition of an address latch outside a preset region. If a first total number is larger than a second total number, there is misposition of an address latch outside a preset region. If a third design parameter is larger than a first total number, there may be omission of an address latch in a DFT circuit, or there may be a main address configuration error in an address latch.

Particularly, the foregoing types of errors are not absolute, and are merely for a designer to refer to. In other words, after detecting an error in an address latch in the DFT circuit, the designer is required to manually verify the error. Therefore, the related errors herein are merely for reference.

It should be noted that, according to some embodiments, the operation of counting to obtain a first total number and a second total number includes:

initializing both the first total number and the second total number to be 0 before transmitting a first main address signal; and updating the first total number with a sum of a first target number and the first total number, and updating the second total number with a sum of a second target number and the second total number, after transmitting a main address signal to a DFT circuit and determining the first target number and the second target number.

It should be understood that, partial information related to the foregoing multiple types of errors during the test may be combined for use, and results thereof may further be combined with each other, therefore the multiple types of errors may be detected in a relatively flexible way, which is not limited herein. Illustratively, a test platform captures two test mode signals which jump after transmitting a main address signal and a sub address signal, and two pieces of target position information thereof are respectively TOP.Chip.*.I_TMLeft. EnEcc and TOP.Chip.*.I_TMRight. EnEcc. The target position information may be configured to determine whether a target address latch corresponding to a main address signal is as expected, and may further be configured to compare whether test mode signal names corresponding to a same address signal are identical to each other.

In this way, multiple types of configuration errors in an address latch may be detected through the method for checking a DFT circuit. If a foregoing common type of error is detected, error information will be printed in a simulation report and a simulation failure will be reported. If no error is detected, and the total number of times that address latches are selected corresponding to all test modes of the chip is detected to be as expected, a simulation success is reported, thereby quickly and efficiently checking whether there is a configuration error in an address latch in the DFT circuit, and improving working efficiency and verification accuracy.

To sum up, there are multiple address latches corresponding to a test mode, which may be distributed in more than 10 designated positions in the chip, and there are multiple non-unique address latches, and then inevitably, there may be multiple types of sporadic human-caused errors in the development of the chip, some of which may be easy to detect in the verification, e.g., a decoding address configuration error of an address latch, initial value configuration error of an address latch and misposition of an address latch, but some of which may be difficult to detect, e.g., address latches in different positions corresponding to a same address signal correspond to different test modes, and misposition of an address latch outside a designated position. Therefore, the embodiments of the disclosure provide a method for checking a DFT circuit, thereby quickly and efficiently checking whether there is a configuration error in an address latch in the DFT circuit, and improving working efficiency and verification accuracy.

Figure 3:
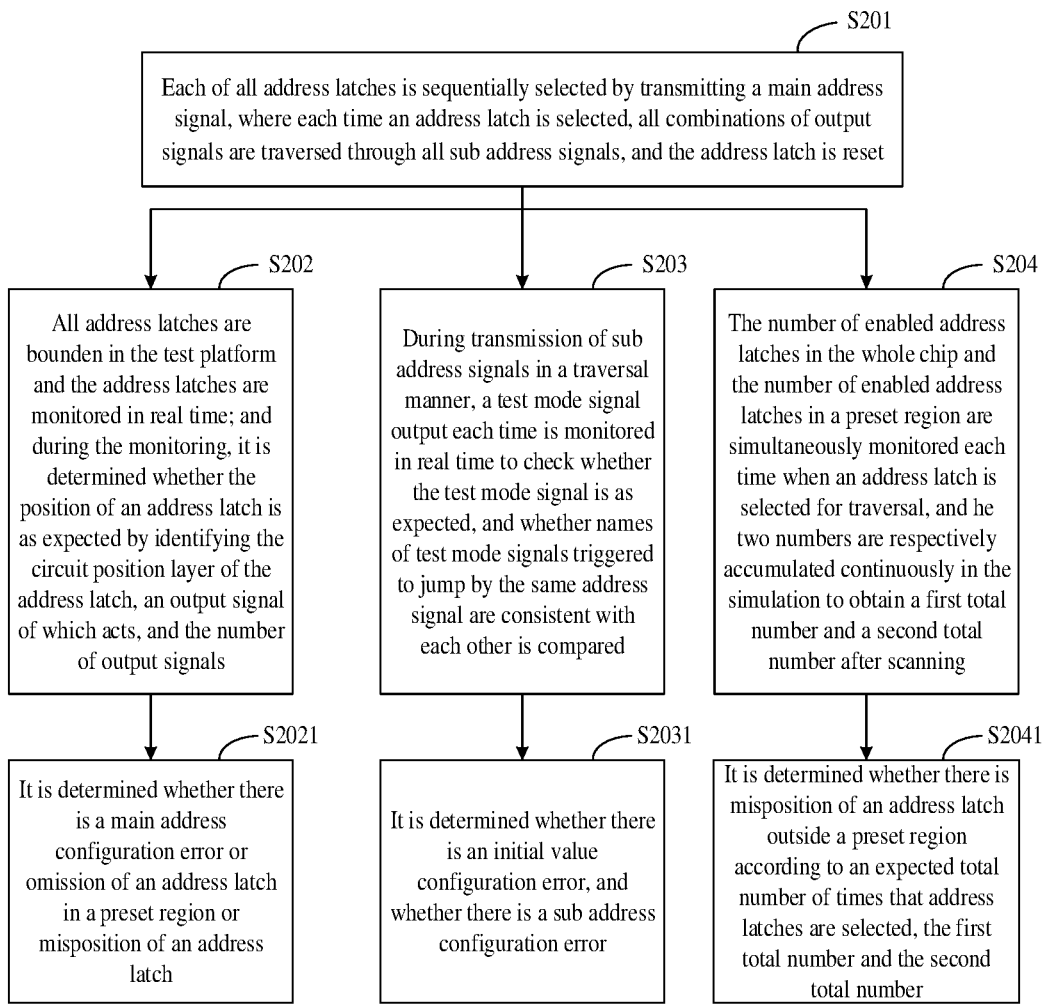
FIG. 3 illustrates a schematic flow diagram of another method for checking a DFT circuit according to an embodiment of the disclosure.

According to another embodiment of the disclosure, FIG. 3 illustrates a schematic diagram of a method for checking a DFT circuit according to the embodiment of the disclosure. As shown in FIG. 3, the method may include operations S201 to S2041.

In S201, each of all address latches is sequentially selected by transmitting a main address signal, where each time an address latch is selected, all combinations of output signals are traversed through all sub address signals, and the address latch is reset.

It should be noted that, the embodiments of the disclosure relate to semiconductor integrated circuits, in particular to memory devices. Specifically, the method for checking a DFT circuit is applied to a test platform, and a program for checking a DFT circuit, which is programmed in the Verilog language or perl language is stored in the test platform to check whether address latches corresponding to all test modes in a DRAM chip are as expected in the design.

Further, the embodiments of the disclosure are intended to illustrate the overall logic of the method for checking a DFT circuit, rather than specific implementation details thereof. Therefore, operation S201 and the following operations of S202, S203 and S204 are not divided according to execution order thereof, and there may be overlap of the operations.

In S202, all address latches are bounden in the test platform and the address latches are monitored in real time; and during the monitoring, it is determined whether the position of an address latch is as expected by identifying the circuit position layer of the address latch, an output signal of which acts, and the number of output signals.

Herein, the number of output signals includes the number of output signals of the whole circuit and the number of output signals merely in a preset region.

In S2021, it is determined whether there is a main address configuration error or omission of an address latch in a preset region or misposition of an address latch.

It should be noted that, the test platform and output signals of address latches corresponding to all test modes in a circuit netlist are bound. Therefore, after the test platform transmits a main address signal and/or sub address signal, when an output signal of an address latch jumps, the monitoring function of the test platform will be triggered to identify the corresponding address latch which acts.

Illustratively, when an output signal of an address latch, which jumps is detected, a $sformat function will be triggered to capture the circuit position layer of the corresponding module. The circuit position layer is a combination of letters and numbers, and the corresponding address latch which acts is identified through keywords match. Illustratively, if circuit position layers of two address latches corresponding to a address same signal are respectively TOP.Chip.*.I_TMLeft.I_LatchX5_1955 and TOP.Chip.*.I_TMRight.I_Latch_278, the two address latches may be distinguished by matching TMLeft and TMRight.

That is, an address latch, an output signal of which acts, is equivalent to the foregoing "target address latch", and the circuit position layer thereof is equivalent to the foregoing "target position information". In this way, the target address latch which acts may be determined through the signal which jumps, and whether the position of the target address latch is as expected may be determined according to corresponding relation between a main address signal and the target address latch, details of which may be understood with reference to those of the foregoing error (1) or error (4).

In S203, during transmission of sub address signals in a traversal manner, a test mode signal output each time is monitored in real time to check whether the test mode signal is as expected, and whether names of test mode signals triggered to jump by the same address signal are identical to each other is compared.

Herein, when the main address signal is correctly configured, if names of test mode signals triggered to jump by the same address signal are identical to each other, there is no sub address configuration error; and if names of test mode signals triggered to jump by the same address signal are not identical to each other, there is a sub address configuration error.

In S2031, it is determined whether there is an initial value configuration error, and whether there is a sub address configuration error.

It should be noted that, when all sub address signals are traversed, whether each output test mode signal is as expected may be tested. Specifically, after transmitting each sub address signal, a level state of each corresponding output pin of a target address latch is captured and converted into a binary array, e.g., 01001. There is an expected correct level state of each output pin in the test platform, and an expected binary array is formed in the same way for comparison to determine whether there is an initial value configuration error, details of which may be understood with reference to those of the foregoing error (3).

Further, when all sub address signals are traversed, whether test mode signals output by address latches (in different positions) corresponding to a same address signal are identical to each other may be compared. After transmitting a main address signal and a corresponding sub address signal, the circuit position layer of an output test mode signal is captured, a string of the lowest layer, i.e., a signal name, is intercepted, and an ASCII code cumulative value of the string is calculated for consistency comparison. Illustratively, circuit position layers of two test mode signals corresponding to a same address signal are respectively TOP.Chip.*.I_TMLeft.EnEcc and TOP.Chip.*.I_TMRight. EnEcc, and an ASCII code cumulative value of the signal name "EnEcc" is as follows: 69+110+69+99+99=446. Whether the ASCII code cumulative values of the two test mode signals are identical to each other is compared to determine whether address latches corresponding to the same address signal are configured to control a same test mode, i.e., whether there is a sub address configuration error, details of which may be understood with reference to those of the foregoing error (2).

In S204, the number of enabled address latches in the whole chip and the number of enabled address latches in a preset region are simultaneously monitored each time when an address latch is selected for traversal, and he two numbers are respectively accumulated continuously in the simulation to obtain a first total number and a second total number after scanning.

Herein, the number of enabled address latches in the whole chip may be configured to be the foregoing first target number, and the number of enabled address latches in a preset region may be configured to be the foregoing second target number.

In S2041, it is determined whether there is misposition of an address latch outside a preset region according to an expected total number of times that address latches are selected, the first total number and the second total number.

In this way, whether there is misposition of an address latch outside a preset region, i.e., error (5) may be determined by comparing the expected total number of times that address latches are selected (i.e., the foregoing third design parameter), the first total number and the second total number.

The embodiment provides a method for checking a DFT circuit. Specific implementations of the foregoing embodiments are illustrated in detail according to the embodiment. The test platform can quickly and efficiently test whether there is a configuration error in an address latch in the DFT circuit, detect a circuit problem in time, and improve work efficiency and verification accuracy.

Figure 4:
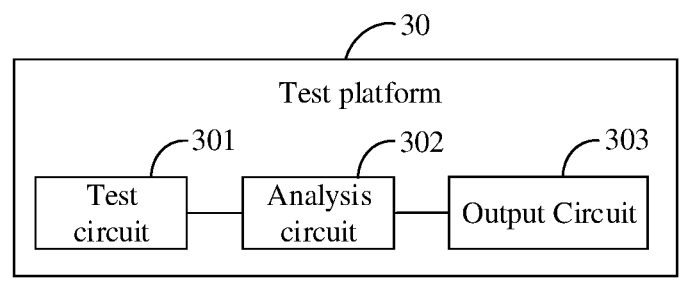
FIG. 4 illustrates a schematic structural diagram of a test platform according to an embodiment of the disclosure.

According to another embodiment of the disclosure, FIG. 4 illustrates a schematic structural diagram of a test platform 30 according to the embodiment of the disclosure on the basis of a concept same as that of the foregoing embodiments. The test platform 30 is connected to a DFT circuit including multiple address latches. As shown in FIG. 4, the test platform 30 includes a test circuit 301, an analysis circuit 302 and an output circuit 303.

The test circuit 301 is configured to transmit a control signal to a DFT circuit to determine test mode signals output by the DFT circuit. The DFT circuit is configured to sequentially select multiple address latches according to the control signal to output the test mode signals.

The analysis circuit 302 is configured to analyze the test mode signals to determine whether the multiple address latches in the DFT circuit have an error.

The output circuit 303 is configured to output a simulation result report.

According to some embodiments, a control signal includes multiple groups of address signals, each group of address signals include a main address signal and a preset number of sub address signals. Accordingly, a test circuit 301 is specifically configured to transmit a main address signal to a DFT circuit to select a target address latch from the multiple address latches, and sequentially transmit a preset number of sub address signals to the DFT circuit to control the target address latch to output the test mode signals in a traversal manner.

According to some embodiments, a test circuit 301 is further configured to reset a target address latch after sequentially transmitting the preset number of sub address signals to a DFT circuit.

According to some embodiments, an analysis circuit 302 is further configured to determine a target address latch and a target number after transmitting a main address signal to a DFT circuit, analyze the target address latch and the target number based on a first design parameter to determine whether there is a first type of error in multiple address latches in the DFT circuit. Herein, the first type of error is a main address configuration error of an address latch, or misposition of an address latch, or omission of an address latch in a preset region.

According to some embodiments, a target number includes a first target number and a second target number, where the first target number is the number of the target address latches and the second target number is the number of the target address latches belonging to the preset region. An analysis circuit 302 is further configured to determine target position information corresponding to each test mode signal according to a preset correlation relationship, perform keyword match processing on the target position information to determine the target address latches, and determine a first target number and a second target number based on the target position information. Herein, the preset correlation relationship is configured to indicate circuit position information of each test mode signal in the DFT circuit.

According to some embodiments, an analysis circuit 302 is further configured to determine a signal value array of each target address latch according to the test mode signals output by the DFT circuit after sequentially transmitting the preset number of sub address signals to the DFT circuit, analyze the signal value array based on a second design parameter to determine whether the multiple address latches in the DFT circuit have a second type of error. Herein, the second type of error is an initial value configuration error of an address latch.

According to some embodiments, an analysis circuit 302 is further configured to determine a level state of a corresponding output pin in a target address latch according to a test mode signal output by a DFT circuit after transmitting one of the sub address signals to the DFT circuit, perform binary conversion processing on the level state of the corresponding output pin in the target address latch to obtain a signal value in a signal value array, and obtain the signal value array after sequentially transmitting the preset number of sub address signals to the DFT circuit.

According to some embodiments, an analysis circuit 302 is further configured to determine multiple signal names according to each test mode signal output by a DFT circuit after transmitting one of the sub address signals to the DFT circuit, perform consistency comparison on the multiple signal names to determine the multiple address latches in the DFT circuit have a third type of error. Herein, the third type of error is a sub address configuration error of an address latch.

According to some embodiments, an analysis circuit 302 is further configured to determine multiple pieces of target position information respectively corresponding to the test mode signals according to a preset correlation relationship, perform character interception on the multiple pieces of target position information to obtain the multiple signal names.

According to some embodiments, an analysis circuit 302 is further configured to determine identifier values respectively corresponding to multiple signal names, compare identifier values respectively corresponding to the multiple signal names to determine whether the multiple signal names are identical to each other. Herein, an identifier value is obtained by accumulating an ASCII code value of each element in one signal name.

According to some embodiments, an analysis circuit 302 is further configured to: after all main address signals are transmitted in a traversal manner to the DFT circuit, count to obtain a first total number and a second total number, where the first total number is the total number of times that multiple address latches in a DFT circuit are selected, and the second total number is the total number of times that multiple address latches in a preset region are selected; and analyze the first total number and the second total number based on a third design parameter to determine whether there is a fourth type of error in the DFT circuit. Herein, the third design parameter is an expected total number of times that address latches in the DFT circuit are selected, and the fourth type of error is misposition of an address latch outside a preset region.

According to some embodiments, an analysis circuit 302 is further configured to initialize both first total number and second total number to be 0 before transmitting a first main address signal, and update the first total number with a sum of a first target number and the first total number, and update the second total number with a sum of a second target number and the second total number after transmitting a main address signal to a DFT circuit and determining the first target number and the second target number.

It should be understood that, according to the embodiments, a "circuit" may be partial circuit, partial processor, partial program or software, etc., and definitely may further be modular or non-modular. Further, according to the embodiments, each component may be integrated into a processing circuit, or each circuit may be arranged physically alone, or two or more circuits may be integrated into a circuit. An integrated circuit may be implemented as hardware or a software function module.

If an integrated circuit is implemented as a software function module and is not sold or used as an independent product, the integrated circuit may be stored in a computer readable storage medium. Thereon, the technical scheme of the embodiments in essence or the part thereof contributing to some implementations, or the whole or partial technical scheme may be implemented as a software product. The computer software product is stored in a storage medium and includes multiple instructions to enable a computer device (which may be a personal computer, server, network device, etc.) or processor to implement all or partial steps of a method according to the embodiments. The storage medium may be a USB flash disk, portable hard disk, ROM (Read-Only Memory), RAM (Random Access Memory), magnetic disk, CD (Compact Disc) or another medium capable of storing a program code.

Therefore, an embodiment provides a non-transitory computer storage medium with computer-executable instructions stored therein. The computer-executable instructions are executed by at least one processor to perform operations of a method for checking a DFT circuit according to any of the foregoing embodiments.

Figure 5:
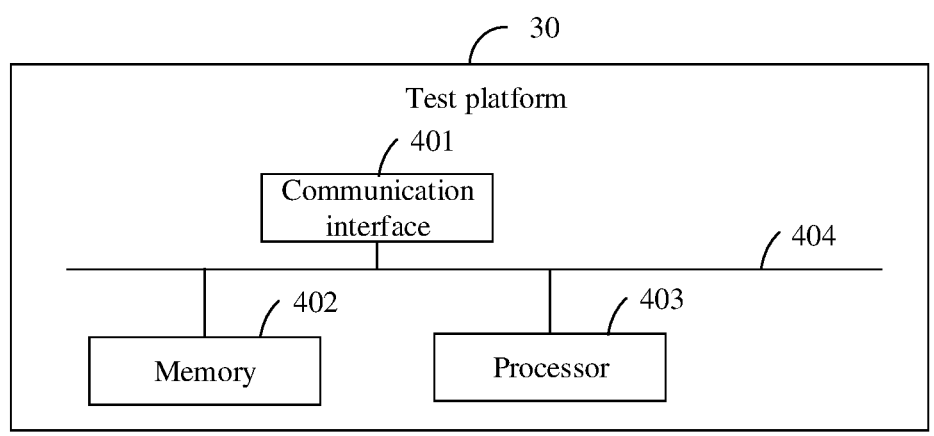
FIG. 5 illustrates a schematic structural diagram of specific hardware of a test platform according to an embodiment of the disclosure.

On the basis of the structure of a foregoing test platform 30 and the computer storage medium, FIG. 5 illustrates a schematic structural diagram of specific hardware of a test platform 30 according to an embodiment of the disclosure.

As shown in FIG. 5, the test platform 30 may include a communication interface 401, a memory 402 and a processor 403, and all components are coupled together through a bus system 404. It should be understood that, the bus system 404 is configured to implement connection communication between the components. The bus system 404 includes a power supply bus, control bus and state signal bus in addition to data bus. However, multiple buses are designated as the bus system 404 in FIG. 5 to facilitate the illustration The communication interface 401 is configured to receive and transmit a signal in receiving and transmitting information from and to another external network element.

The memory 402 is configured to store computer-executable instructions which can be run by the processor 403.

The processor 403, when the computer-executable instructions are run, is configured to:
  transmit a control signal to a DFT circuit to determine test mode signals output by the DFT circuit, the DFT circuit being configured to sequentially select multiple address latches according to the control signal to output the test mode signals;
  analyze the test mode signals to determine whether the multiple address latches in the DFT circuit have an error; and
  output a simulation result report.

It should be understood that, the memory 402 according to the embodiment of the disclosure may be a volatile memory or non-volatile memory or may include both volatile memory and non-volatile memory. The non-volatile memory may be ROM (Read-Only Memory), PROM (Programmable ROM), EPROM (Erasable PROM), EEPROM (Electrically EPROM), or flash memory. The volatile memory may be a RAM (Random Access Memory) configured to be external cache. Illustratively, there are many available types of RAM, e.g., SRAM (Static RAM), DRAM (Dynamic RAM), SDRAM (Synchronous DRAM), DDRSDRAM (Double Data Rate SDRAM), ESDRAM (Enhanced SDRAM), SLDRAM (Synchronous Link DRAM), and DRRAM (Direct Rambus RAM), which is not limited herein. The memory 402 of the system and method herein is intended to include but not limited to the foregoing types and any other suitable type of memory.

The processor 403 may be an integrated circuit chip with signal processing capability. In the implementation, each step of the foregoing method may be implemented through an integrated logic circuit of hardware in the processor 403 or an instruction configured in the form of software. The processor 403 may be a general-purpose processor, DSP (Digital Signal Processor), ASIC (Application Specific Integrated Circuit), FPGA (Field Programmable Gate Array), or another programmable logic device, discrete gate or transistor logic device, or discrete hardware component to implement a method, step, and logic block diagram according to the embodiments of the disclosure. The general-purpose processor may be a microprocessor or any conventional processor, etc. The operations of the method according to the embodiments of the disclosure may be directly implemented through a hardware decoding processor or through a combination of hardware and a software module in the decoding processor. The software module may be stored in a RAM, flash memory, ROM, PROM or EPROM, register and another storage medium developed in the art. The storage medium is configured to be in the memory 402, and the processor 403 is configured to read information in the memory 402 and perform operations of the foregoing method in combination with hardware thereof.

It should be understood that, the embodiments herein may be implemented through hardware, software, firmware, middleware, microcode, or a combination thereof. In the implementation through hardware, a processing circuit may be implemented in one or more ASICs (Application Specific Integrated Circuit), DSPs (Digital Signal Processor), DSPDs (DSP Device), PLDs (Programmable Logic Device), FPGAs (Field Programmable Gate Array), general-purpose processors, controllers, microcontrollers, microprocessors, other electronic circuits, or a combination thereof configured to implement a function according to the disclosure.

In the implementation through software, a technique herein may be implemented through a module (e.g., a process, function, etc.) configured to implement a function herein. A software code may be stored in a memory and executed by a processor. The memory may be implemented inside or outside the processor.

Alternatively, according to another embodiment, a processor 403 is further configured to perform operations of a method according to any of the foregoing embodiments when running a computer program.

The embodiments of the disclosure provide a test platform, thereby quickly and efficiently checking whether there is a configuration error in an address latch in a DFT circuit, detecting a circuit problem in time, and improving work efficiency and verification accuracy.

Figure 6:
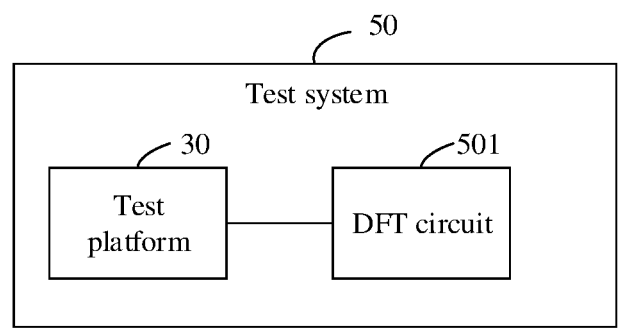
FIG. 6 illustrates a schematic structural diagram of a test system according to an embodiment of the disclosure.

According to another embodiment of the disclosure, FIG. 6 illustrates a schematic structural diagram of a test system 50 on the basis of a concept same as that of the foregoing embodiments according to the embodiment of the disclosure. As shown in FIG. 6, the test system 50 includes at least a test platform 30 and a DFT circuit 501 including multiple address latches.

In this way, the test platform 30 can quickly and efficiently checking whether there is a configuration error in an address latch in the DFT circuit 501, thereby improving work efficiency and verification accuracy.

The foregoing description merely illustrates preferred embodiments of the disclosure and is not intended to limit the scope of the disclosure.

It should be noted that, herein the terms "including", "comprising" or any other variation thereof are intended to mean covering on a non-exclusive basis. Therefore, a process, method, object or device including multiple elements includes not only the elements, but also other elements not explicitly listed, or inherent to the process, method, object or device. Unless otherwise defined, an element defined by "including a/an" does not preclude another same element in a process, method, object or device including the element.

The sequential numbers of the embodiments of the disclosure are merely for the description and do not represent any superiority or inferiority thereof.

Methods according to the method embodiments of the disclosure may be combined with each other on a non-conflict basis to obtain new method embodiments.

Features according to the product embodiments of the disclosure may be combined with each other on a non-conflict basis to obtain new product embodiments.

Features according to the method or device embodiments of the disclosure may be combined with each other on a non-conflict basis to obtain new method or device embodiments.

The foregoing description merely illustrates specific implementations of the disclosure, and the scope of the disclosure is not limited thereto. Variations or substitutions within the technical scope of the disclosure may be derived by those skilled in the art, which shall fall within the scope of the disclosure. Therefore, the scope of the disclosure shall be defined by the scope of the claims.

The embodiments of the disclosure provide a method for checking a DFT circuit, a test platform, a storage medium and a test system, thereby quickly and efficiently checking whether there is a configuration error in an address latch in the DFT circuit, detecting a circuit problem in time, and improving work efficiency and verification accuracy.

What is claimed is:

1. A method for checking a Design for Test (DFT) circuit, applied to a test platform, wherein the DFT circuit comprises multiple address latches, and the test platform is connected to the DFT circuit, and the method comprises:
    transmitting a control signal to the DFT circuit to determine test mode signals output by the DFT circuit, wherein the DFT circuit is configured to sequentially select multiple address latches according to the control signal to output the test mode signals;
    analyzing the test mode signals to determine whether the multiple address latches in the DFT circuit have an error; and
    outputting a simulation result report.

2. The method of claim 1, wherein the control signal comprises multiple groups of address signals, each group of address signals comprise a main address signal and a preset number of sub address signals, and transmitting the control signal to the DFT circuit to determine the test mode signals output by the DFT circuit comprises:
    transmitting the main address signal to the DFT circuit to select a target address latch from the multiple address latches; and
    sequentially transmitting the preset number of sub address signals to the DFT circuit to control the target address latch to output all test mode signals in a traversal manner.

3. The method of claim 2, further comprising: after sequentially transmitting the preset number of sub address signals to the DFT circuit,
    resetting the target address latch.

4. The method of claim 2, wherein analyzing the test mode signals to determine whether the multiple address latches in the DFT circuit have an error comprises:
    determining the target address latch and a target number after transmitting the main address signal to the DFT circuit; and
    analyzing the target address latch and the target number based on a first design parameter to determine whether the multiple address latches in the DFT circuit have a first type of error,
    wherein the first type of error is a main address configuration error of an address latch, or misposition of an address latch, or omission of an address latch in a preset region.

5. The method of claim 4, wherein the target number comprises a first target number and a second target number, and the first target number is a number of the target address latches and the second target number is a number of the target address latches belonging to the preset region; and
    analyzing the target address latch and the target number based on the first design parameter to determine whether the multiple address latches in the DFT circuit have a first type of error comprises:
    determining target position information corresponding to each test mode signal according to a preset correlation relationship, wherein the preset correlation relationship is configured to indicate circuit position information of each test mode signal in the DFT circuit; and
    performing keyword match processing on the target position information to determine the target address latches, and determining the first target number and the second target number based on the target position information.

6. The method of claim 2, wherein analyzing the test mode signals to determine whether the multiple address latches in the DFT circuit have an error further comprises:
    determining a signal value array of each target address latch according to the test mode signals output by the DFT circuit after sequentially transmitting the preset number of sub address signals to the DFT circuit; and
    analyzing the signal value array based on a second design parameter to determine whether the multiple address latches in the DFT circuit have a second type of error,
    wherein the second type of error is an initial value configuration error of an address latch.

7. The method of claim 6, wherein determining the signal value array of each target address latch according to the test mode signals output by the DFT circuit comprises:
    determining a level state of a corresponding output pin in the target address latch according to each test mode signal output by the DFT circuit after transmitting one of the sub address signals to the DFT circuit;
    performing binary conversion processing on the level state of the corresponding output pin in the target address latch to obtain a signal value in the signal value array; and
    obtaining the signal value array after sequentially transmitting the preset number of sub address signals to the DFT circuit.

8. The method of claim 2, wherein when there are multiple target address latches, the method further comprises:
    determining multiple target signal names according to each test mode signal output by the DFT circuit after transmitting one of the sub address signals to the DFT circuit; and
    performing consistency comparison on the multiple target signal names to determine whether the multiple address latches in the DFT circuit have a third type of error,
    wherein the third type of error is a sub address configuration error of an address latch.

9. The method of claim 8, wherein determining multiple signal names according to each test mode signal output by the DFT circuit comprises:
    determining multiple pieces of target position information respectively corresponding to the test mode signals according to a preset correlation relationship; and
    performing character interception on the multiple pieces of target position information to obtain the multiple signal names.

10. The method of claim 9, wherein performing consistency comparison on the multiple signal names comprises:
    determining identifier values respectively corresponding to the multiple signal names, wherein the identifier value is obtained by accumulating an ASCII code value of each element in one signal name; and
    comparing the identifier values respectively corresponding to the multiple signal names to determine whether the multiple signal names are identical to each other.

11. The method of claim 5, further comprising:
    counting to obtain a first total number and a second total number after all main address signals are transmitted in a traversal manner to the DFT circuit, wherein the first total number is the total number of times that multiple address latches in the DFT circuit are selected, and the second total number is the total number of times that multiple address latches in a preset region are selected; and analyzing the first total number and the second total number based on a third design parameter to determine whether there is a fourth type of error in the DFT circuit, wherein the third design parameter is an expected total number of times that address latches in the DFT circuit are selected, and the fourth type of error is misposition of an address latch outside a preset region.

12. The method of claim 11, wherein counting to obtain the first total number and the second total number comprises:

initializing both the first total number and the second total number to be 0 before transmitting a first main address signal; and updating the first total number with a sum of a first target number and the first total number, and updating the second total number with a sum of a second target number and the second total number after transmitting the main address signal to the DFT circuit and determining the first target number and the second target number.

13. A test platform connected to a Design for Test (DFT) circuit comprising multiple address latches, comprising a test circuit, an analysis circuit, and an output circuit, wherein:

the test circuit is configured to transmit a control signal to the DFT circuit to determine test mode signals output by the DFT circuit, wherein the DFT circuit is configured to sequentially select multiple address latches according to the control signal to output the test mode signals;

the analysis circuit is configured to analyze the test mode signals to determine whether the multiple address latches in the DFT circuit have an error; and the output circuit is configured to output a simulation result report.

14. A test platform connected to a Design for Test (DFT) circuit comprising multiple address latches, the test platform comprising a memory and a processor, wherein:

the memory is configured to store computer-executable instructions which can be run by the processor; and the processor is configured to, when the computer-executable instructions are run, perform operations of:

transmitting a control signal to the DFT circuit to determine test mode signals output by the DFT circuit, wherein the DFT circuit is configured to sequentially select multiple address latches according to the control signal to output the test mode signals;

analyzing the test mode signals to determine whether the multiple address latches in the DFT circuit have an error, and outputting a simulation result report.

15. A non-transitory computer storage medium with computer-executable instructions stored therein, wherein the computer-executable instructions are executed by at least one processor to perform operations of a method of claim 1.

16. A test system, comprising at least a test platform of claim 13 and a Design for Test (DFT) circuit comprising multiple address latches.

* * * * *